US012690126B2

(12) United States Patent
Peykanu

(10) Patent No.: US 12,690,126 B2
(45) Date of Patent: Jul. 21, 2026

(54) PCB FOR AN IC CHIP WITH D-PHY FUNCTION AND C-PHY FUNCTION AND AN PCB ASSEMBLY INCLUDING THE IC CHIP

(71) Applicant: Aptiv Technologies AG, Schaffhausen (CH)

(72) Inventor: Meysam Peykanu, Siegen (DE)

(73) Assignee: Aptiv Technologies AG, Schaffhausen (CH)

( * ) Notice: Subject to any disclaimer, the term of this patent is extended or adjusted under 35 U.S.C. 154(b) by 234 days.

(21) Appl. No.: 18/627,179

(22) Filed: Apr. 4, 2024

(65) Prior Publication Data

US 2025/0261304 A1 Aug. 14, 2025

(30) Foreign Application Priority Data

Feb. 12, 2024 (EP) .................................... 24157115

(51) Int. Cl.
*H05K 1/18* (2026.01)
*H05K 1/02* (2006.01)
*H05K 1/181* (2026.01)

(52) U.S. Cl.
CPC .......... *H05K 1/0296* (2013.01); *H05K 1/181* (2013.01); *H05K 2201/10022* (2013.01); *H05K 2201/10318* (2013.01)

(58) Field of Classification Search
CPC ................. H05K 1/0296; H05K 1/181; H05K 2201/10022; H05K 2201/10318

USPC .......................................................... 361/782
See application file for complete search history.

(56) References Cited

U.S. PATENT DOCUMENTS

| | | | |
|---|---|---|---|
| 2017/0032757 A1* | 2/2017 | Itoigawa | ................ G09G 5/008 |
| 2022/0060358 A1* | 2/2022 | Lee | ........................... H04N 5/06 |
| 2023/0058759 A1* | 2/2023 | Hori | .................... H04L 25/0276 |

OTHER PUBLICATIONS

"Specification for C-PHY," MIPI Alliance, Version 2.1, Apr. 1, 2021.
"Specification for D-PHY," MIPI Alliance, Versoin 3.0, Jun. 8, 2021.

* cited by examiner

*Primary Examiner* — Binh B Tran
(74) *Attorney, Agent, or Firm* — Harness, Dickey & Pierce, P.L.C.

(57) ABSTRACT

A printed circuit board, PCB, comprising: a first pin pad (PP1), adapted to be connected to a first pin of an integrated circuit, IC, chip, wherein the first pin of the IC chip is a pin for a D-PHY function and a C-PHY function provided by the IC chip; a first wire (W1), adapted as a line for the D-PHY function; a second wire (W2), adapted as a line for the C-PHY function; and a first assembly option module (A1), adapted to provide a first option of connecting the first pin pad (PP1) to the first wire (W1) if the IC chip to be assembled onto the PCB is to provide the D-PHY function, or to provide a second option of connecting the first pin pad (PP1) to the second wire (W2) if the IC chip to be assembled onto the PCB is to provide the C-PHY function.

12 Claims, 4 Drawing Sheets

Figure 1:
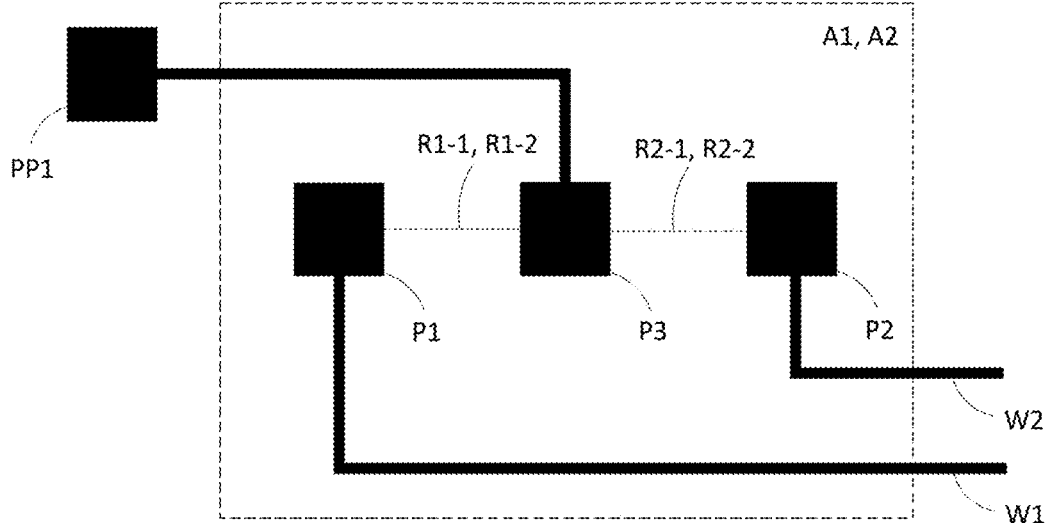

PCB FOR AN IC CHIP WITH D-PHY FUNCTION AND C-PHY FUNCTION AND AN PCB ASSEMBLY INCLUDING THE IC CHIP

CROSS-REFERENCE TO RELATED APPLICATIONS

This application claims the benefit and priority of European patent application number 24157115.7, filed on Feb. 12, 2024. The entire disclosure of the above application is incorporated herein by reference.

FIELD

This section provides background information related to the present disclosure which is not necessarily prior art.

The present disclosure relates to a printed circuit board (PCB) for an integrated circuit (IC) chip with D-PHY function and C-PHY function according to MIPI (Mobile Industry Processor Interface) alliance, and an PCB assembly including the IC chip.

BACKGROUND

MIPI Alliance is a collaborative global organization serving industries that develop mobile and mobile-influenced devices. The focus of the organization is to design and promote hardware and software interfaces that simplify the integration of components built into a device, from the antenna and modern, to peripherals and the application processor.

Under MIPI Alliance, D-PHY provides a flexible, low-cost, High-Speed serial interface solution for communication interconnection between components inside a mobile device. Traditionally, these interfaces are CMOS parallel busses at low bit rates with slow edges for electromagnetic interference (EMI) reasons. The D-PHY solution enables significant extension of the interface bandwidth for more advanced applications. The D-PHY solution can be realized with very low power consumption.

The D-PHY provides a synchronous connection between Master and Slave. A practical D-PHY Configuration consists of a clock signal and one or more data signals. The clock signal is Unidirectional, originating at the Master and terminating at the Slave. The data signals can either be Uni-directional or Bi-directional depending on the selected options.

D-PHY is primarily intended to define a solution for a data rate range of 80 to 1500 Mbps per data signal without deskew calibration, up to 2500 Mbps with deskew calibration, and up to 9,000 Mbps with equalization.

Under MIPI Alliance, C-PHY, as another standard, provides a High-Speed serial interface with high throughput performance over bandwidth limited channels for connecting to peripherals, including displays and cameras. The C-PHY is based on 3-Phase symbol encoding technology delivering 2.28 bits per symbol over three-wire trios and clock timing is encoded into each symbol. The maximum symbol rate capability ranges from 0.08 Gsps to 6 Gsps.

SUMMARY

This section provides a general summary of the disclosure, and is not a comprehensive disclosure of its full scope or all of its features.

It is provided a printed circuit board (PCB) for an integrated circuit (IC) chip with D-PHY function and C-PHY function according to MIPI (Mobile Industry Processor Interface) alliance, and an PCB assembly including the IC chip.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Exemplary embodiments and functions of the present disclosure are described herein in conjunction with the following drawings.

FIG. 1 schematically shows an illustration of a first example of an assembly option module.

Figure 2:
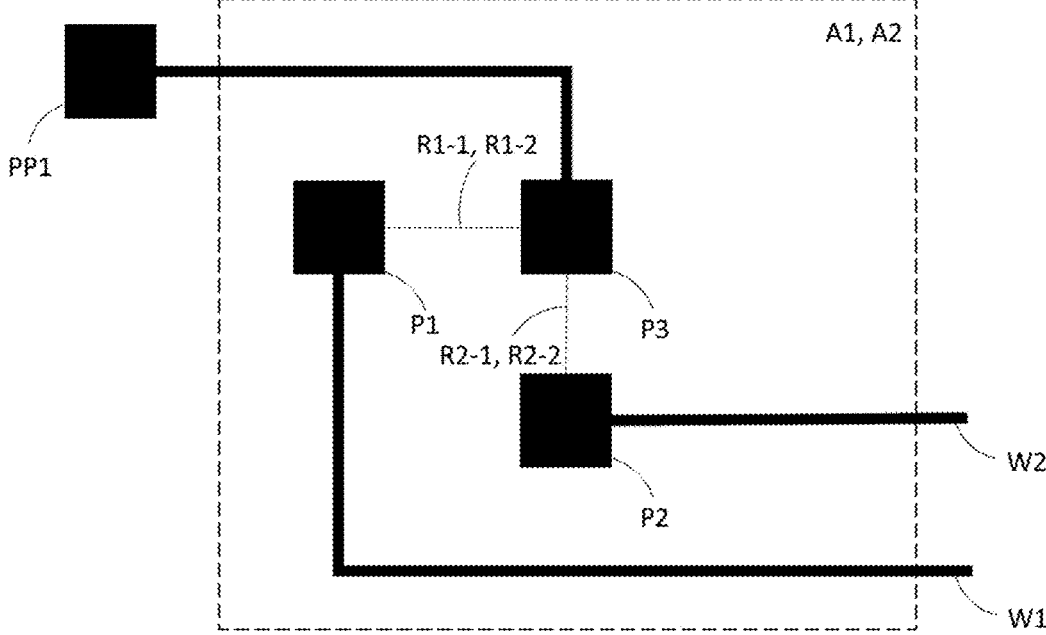

FIG. 2 schematically shows an illustration of a second example of an assembly option module.

Figure 3:
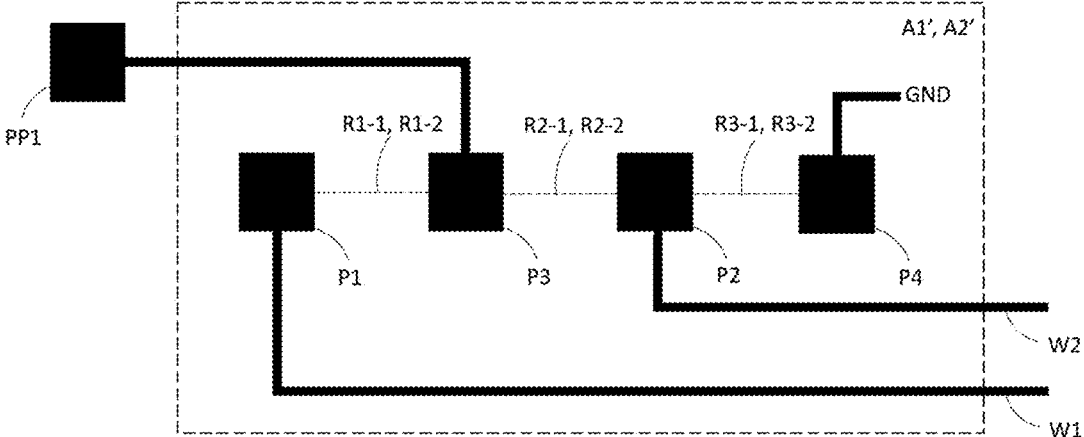

FIG. 3 schematically shows an illustration of a third example of an assembly option module.

Figure 4:
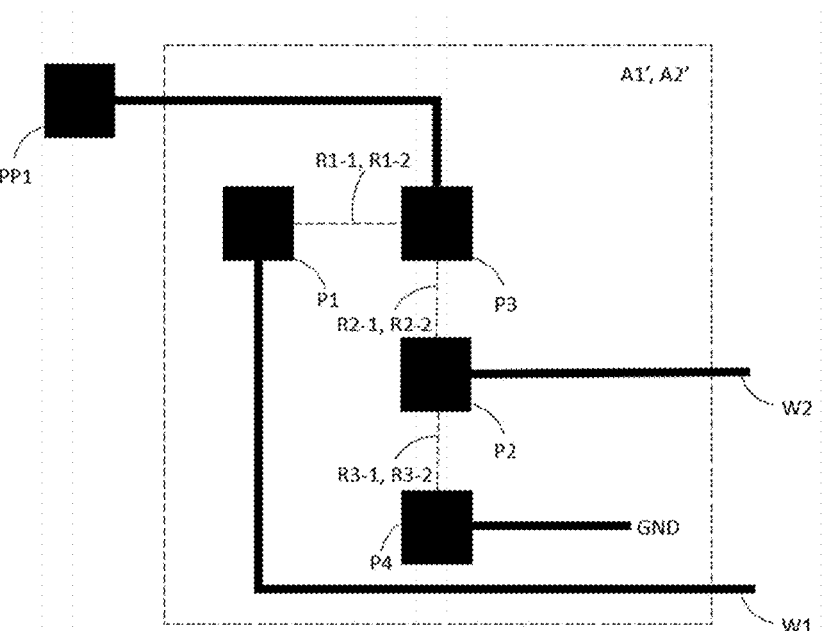

FIG. 4 schematically shows an illustration of a fourth example of an assembly option module.

Figure 5:
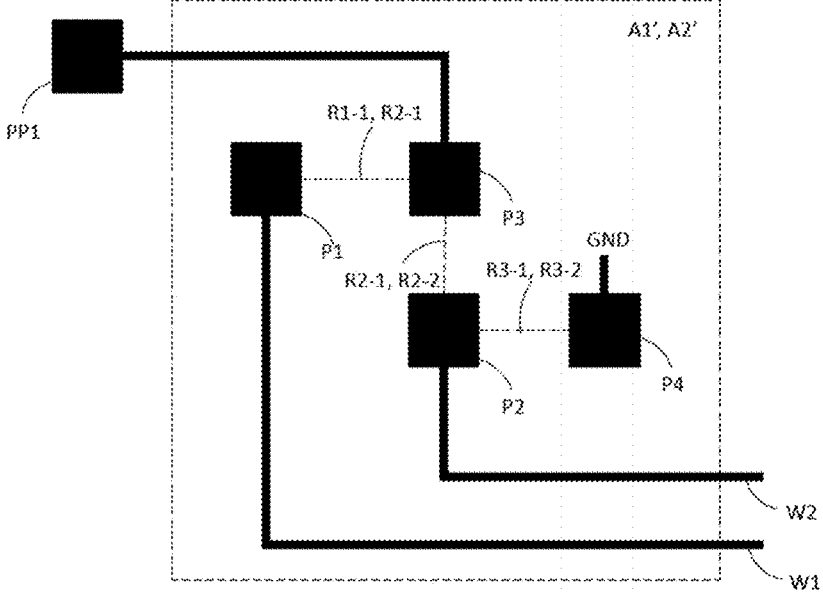

FIG. 5 schematically shows an illustration of a fifth example of an assembly option module.

Figure 6:
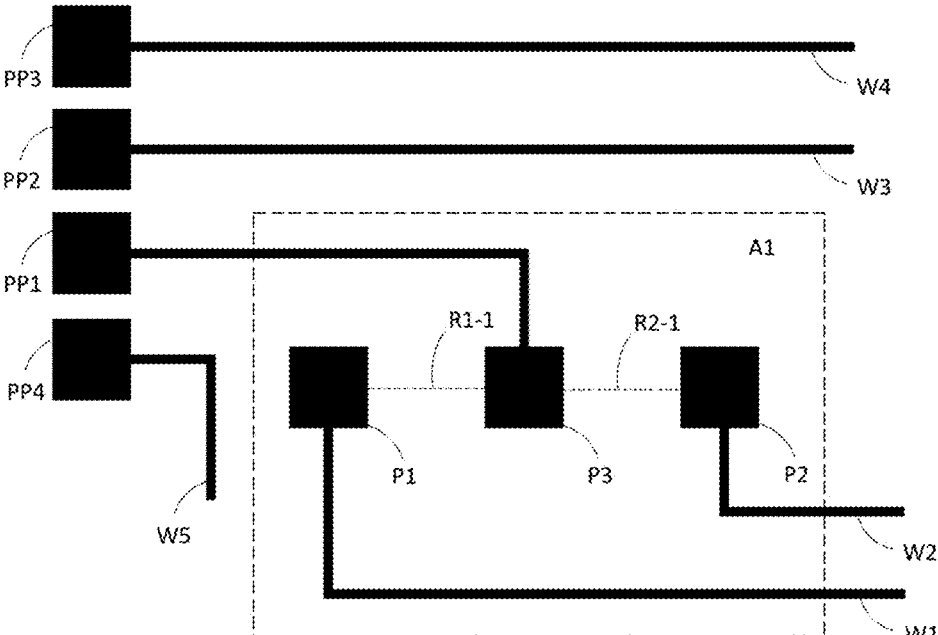

FIG. 6 schematically shows an illustration of a first example in the PCB.

Figure 7:
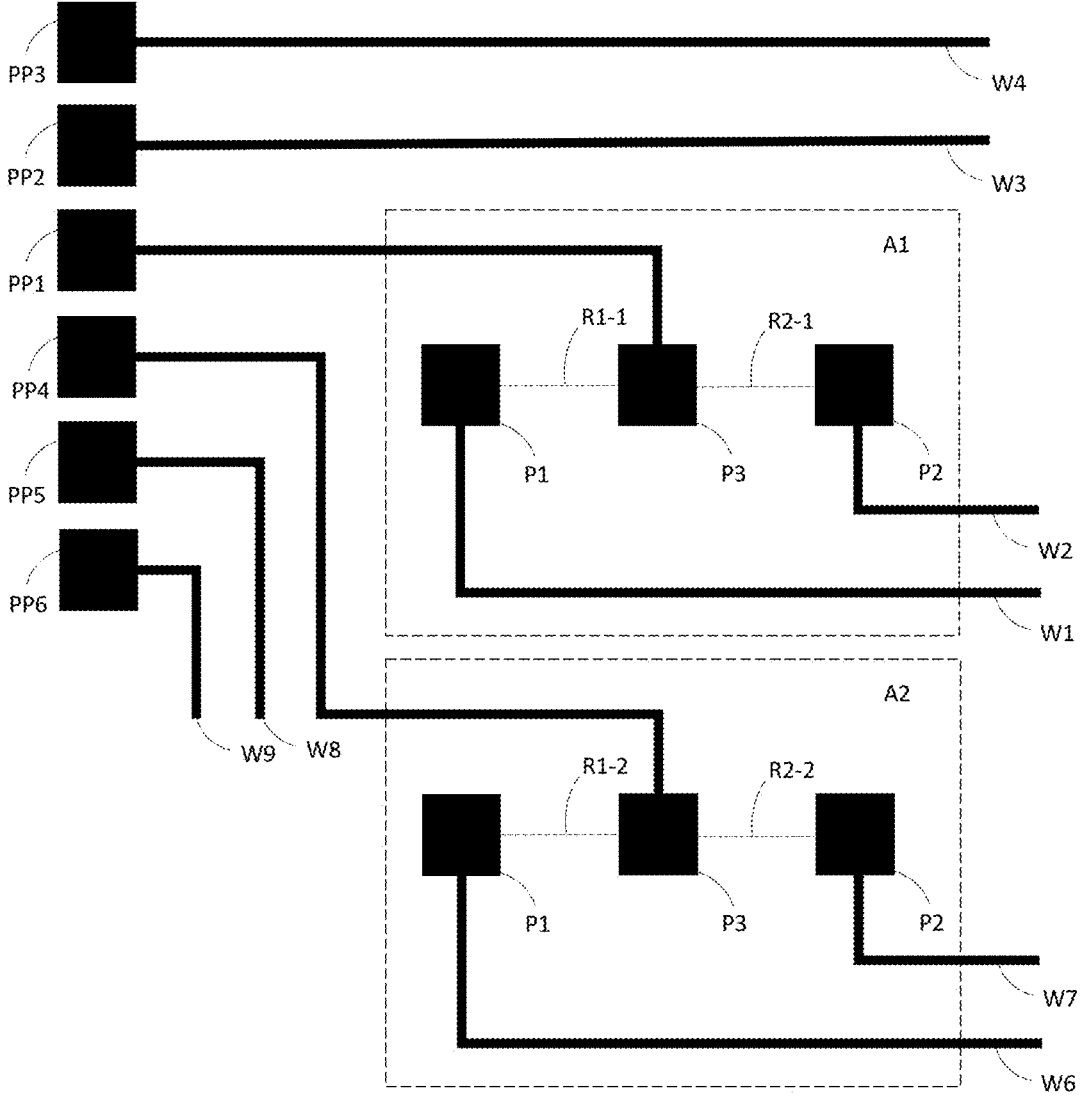

FIG. 7 schematically shows an illustration of a second example in the PCB.

Corresponding reference numerals indicate corresponding parts throughout the several views of the drawings.

DETAILED DESCRIPTION

Example embodiments will now be described more fully with reference to the accompanying drawings.

In D-PHY, a Lane consists of two lines, i.e., a pair of lines, which can be called in short as "a pair", wherein a line may also be called as a wire. A Lane can function either as a Clock Lane for clock signal transmission or as a Data Lane for data signal transmission. In D-PHY, a Link refers to a connection between two devices, e.g., between two ICs, containing one Clock Lane and at least one Data Lane.

In High-Speed mode of D-PHY each Lane is terminated on both sides and driven by a low-swing, differential signal, i.e., each Lane being a differential pair of lines, which can be called in short as "a differential pair". In Low-Power mode of D-PHY all lines are operated single-ended and non-terminated. The reference characteristic impedance level is 100 Ohm (+/−10%) for a differential pair of lines, and 50 Ohm (+/−10%) for a single-ended line.

On the other hand, C-PHY uses High-Speed data coding that differs substantially from the D-PHY clock-forwarding system.

C-PHY uses a group of three lines (or called as wires instead of lines), rather than conventional pairs of lines. A group of three lines can also be called a trio. A group of three lines forms a Lane, while a Link as a connection between two devices contains at least one Lane.

In High-Speed mode of C-PHY, each Lane is terminated on both sides and driven by a low-swing, 3-Phase signal. In this case, each pair of lines from the three lines of a Lane forms a differential pair of lines (may be shorted as "a differential pair"), resulting in three differential pairs in total, and thus three differential receivers are needed on the receiving side. In Low-Power mode of C-PHY, all lines of a Lane are operated single-ended and non-terminated. The reference characteristic impedance level is 100 Ohm (+/−10%) for each differential pair, and 50 Ohm (+/−10%) for each single-ended line.

In C-PHY, multiple bits are encoded into each symbol, and the data rate is about 2.28 times of the symbol rate. Clock timing is encoded into each symbol. This is accomplished by requiring that the combination of voltages driven onto the three lines must change at every symbol boundary. This simplifies clock recovery.

C-PHY has many characteristics in-common with D-PHY, and many parts of C-PHY are adapted from D-PHY. Therefore, it is possible to design a dual-mode device, e.g., a dual-mode IC chip, in which C-PHY and D-PHY coexist using basically the same pins. That is, the chip may be designed to have both C-PHY and D-PHY functions, and can be configured to provide one of C—PHY and D-PHY functions. A pin of the IC chip may be used for a line of C-PHY function if the IC chip is configured to provide C-PHY function, while the same pin of the IC chip may be used for a line of D-PHY function if the IC chip is configured to provide D-PHY function.

For such a dual-mode IC chip, two different PCBs have to be designed and manufactured for each mode. That is, a first PCB is designed for the D-PHY mode, so that when the IC chip is configured to provide D-PHY function, the IC chip is mounted on to the first PCB; a second PCB is designed for the C-PHY mode, so that when the IC chip is configured to provide C-PHY function, the IC chip is mounted on to the second PCB. This means double spending in design and manufacture time and cost.

A universal design is proposed here which uses a same PCB with assembly option techniques to support both C-PHY and D-PHY interfaces by a same layout. When a dual-mode IC chip is configured to provide D-PHY function and mounted onto the PCB, the PCB is configured by an assembly option to connect the IC chip to the wire or wires for D-PHY function in the layout; and when the dual-mode IC chip is configured to provide C-PHY function and mounted onto the PCB, the PCB is configured by another assembly option to connect the IC chip to the wire or wires for C-PHY function in same the layout.

As shown in FIG. 1, in an example, a PCB provides a first pin pad PP1, adapted to be connected to a first pin of an IC chip, wherein the first pin of the IC chip is a pin for a D-PHY function and a C-PHY function provided by the IC chip. That is, when the IC chip is configured to provide D-PHY function, the first pin is used for a line for the D-PHY function; and when the IC chip is configured to provide C-PHY function, the first pin is used for a line for the C-PHY function.

The PCB provides a first wire W1 adapted as a line for the D-PHY function, and a second wire W2 adapted as a line for the C-PHY function.

The PCB further provides a first assembly option module A1, which is adapted to provide a first option of connecting the first pin pad PP1 to the first wire W1 if the IC chip to be assembled onto the PCB is to provide the D-PHY function, or to provide a second option of connecting the first pin pad PP1 to the second wire W2 if the IC chip to be assembled onto the PCB is to provide the C-PHY function.

The first assembly option module A1 may further provide a third option of connecting the second wire W2 to the ground if the IC chip to be assembled onto the PCB is to provide the D-PHY function. Thus, the unused second wire W2 as a line for a trio of the C-PHY is connected to the ground to achieve a better signal integrity.

For example, as shown in FIG. 1, the first assembly option module A1 may comprise a first assembly option pad P1 connected to the first wire W1, a second assembly option pad P2 connected to the second wire W2, and a third assembly option pad P3 connected to the first pin pad PP1. The first assembly option pad P1, the second assembly option pad P2, and the third assembly option pad P3 are not electrically connected with each other, and are so arranged that, as the first option, the first assembly option pad P1 and the third assembly option pad P3 can be electrically connected through a first conductor R1-1, and, as the second option, the second assembly option pad P2 and the third assembly option pad P3 can be electrically connected through a second conductor R2-1.

The first assembly option module A1 is not limited by the arrangement of the layout shown in FIG. 1, but can be any possible arrangement that can realize the function of assembly options as mentioned above, e.g., an alternative arrangement shown in FIG. 2 may be used.

As shown in FIG. 3, the first assembly option module A1' may further comprise a fourth assembly option pad P4 connected to the ground GND, and the fourth assembly option pad P4 is not electrically connected to any one of the first assembly option pad P1, the second assembly option pad P2, or the third assembly option pad P3, and is so arranged that, as the third option, the fourth assembly option pad P4 and the second assembly option pad P2 can be electrically connected through a third conductor R3-1.

The first assembly option module A1' with the third option is not limited by the arrangement of the layout shown in FIG. 3, but can be any possible arrangement that can realize the function of assembly options as mentioned above, e.g., one of the alternative arrangements shown in FIG. 4 and FIG. 5 may be used.

Further, in the first assembly option module A1, the wires and the pads are not necessarily arranged on the same layer of the PCB, as long as the function of the assembly options as mentioned above can be realized.

The first pin of the IC chip may be any pin that is commonly used for D-PHY and C-PHY functions.

The PCB may be designed, according to practical requirements, to route the first pin pad PP1 corresponding to the first pin of the IC chip to a first destination through the first wire W1 when the IC chip is to be configured to provide D-PHY function, and to route the first pin pad PP1 corresponding to the first pin of the IC chip to a second destination through the second wire W2 when the IC chip is to be configured to provide C-PHY function. Hence, the first assembly option module A1 also provides the options for routing to the first destination or second destination.

The PCB may also be designed, no matter if D-PHY or C-PHY function is to be provided, to route the first pin pad PP1 corresponding to the first pin of the IC chip to a same destination, e.g., a corresponding pin pad for a corresponding pin of another IC chip to be mounted on the PCB. In such a case, the requirements for the wire for D-PHY function and the requirements for the wire for C-PHY function may be different, wherein the requirements may comprise at least one of characteristic impendence, or the total length of the wire.

For example, the wire for D-PHY function, e.g., the wire W1, may correspond to a line of a Clock Lane, while the wire for C-PHY function, e.g., the wire W2, may correspond to a line of a trio of the C-PHY function, and thus they have different requirements. For this case, the PCB may provide on the side of the above-mentioned another IC chip also with an assembly option module having the same function as that of the first assembly option module A1.

That is, when the two IC chips on both sides are to be configured to provide D-PHY function, the two assembly option modules on the two sides are both configured to provide the first option to connect the first wire W1 and preferably to provide the third option to connect the second wire W2 to the ground; and when the two IC chips on both sides are to be configured to provide C-PHY function, the two assembly option modules on the two sides are both configured to provide the second option to connect the second wire W2.

The two assembly option modules on the two sides do not necessarily use the same arrangement as long as each of them can realize the assembly options as mentioned above. For example, one assembly option module may use the arrangement shown in FIG. 3 and the other may use the arrangement shown in FIG. 4.

Further, a PCB may include a second assembly option module A2, e.g., as shown in FIG. 7, connected to another pin pad corresponding to another pin of the IC chip commonly used for D-PHY and C-PHY functions.

Each of the conductors used for any of the assembly option modules can be any kind of conductor that can connect two relevant pads in the first assembly option module. Preferably, at least one of the conductors is a 0 Ohm resistor, more preferably a surface mounted device (SMD) 0 Ohm resistor when the two relevant pads are arranged nearby on the same layer of the PCB. A 0 Ohm resistor does not mean that its resistance is absolutely 0 Ohm, but means that its resistance is very close to 0 Ohm and thus can be neglected.

First Example

An IC chip may use 4 pins as common pins for D-PHY and C-PHY functions. The 4 pins are not necessarily arranged together one neighboring another on the IC chip.

When the IC chip is configured to provide D-PHY function, 2 of the 4 pins are used for 2 lines of a Clock Lane and the other 2 of the 4 pins are used for 2 lines of a Data Lane. The Clock Lane and the Data Lane form a minimum Link of D-PHY function between the IC chip and another device.

When the IC chip is configured to provide C-PHY function, 3 of the 4 pins are used for the 3 lines of a trio, i.e., a Lane, as a minimum Link of C-PHY function between the IC chip and another device. The other one of the 4 pins is idle in the C-PHY function.

For such an IC chip, a PCB may be designed to include the arrangement shown in FIG. 6, of which the pin pads PP1, PP2, PP3, and PP4 correspond to the 4 pins of the IC chip.

The wires W3 and W4 correspond to the two lines of the Data Lane of the D-PHY function, and correspond to two lines out of the three lines of the trio of the C-PHY function.

The wire W5 corresponds to one line out of the two lines of the Clock Lane of the D-PHY function, and is not used in the C-PHY function.

The wire W1 corresponds to the other line out of the two lines of the Clock Lane of the D-PHY function.

The wire W2 corresponds to the other line out of the three lines of the trio of the C-PHY function.

When the IC chip to be assembled onto this PCB is to be configured to provide D-PHY function, a conductor R1-1 is mounted onto the PCB to connect the pad P1 and pad P3 as the first option of the first assembly option module A1, and preferably a conductor R3-1 is mounted onto the PCB to connect the pad P2 and pad P4 to ground the wire W2 if the first assembly option module A1 provides the third option, e.g., as shown in FIGS. 3 to 5. As a result, the wire W1 and the wire W5 function as the two lines of the Clock Lane of the D-PHY function. At the same time, the wires W3 and W4 function as the two lines of the Data Lane of the D-PHY function.

In this case, the wires W3 and W4 form the Data Lane of the D-PHY function, and thus are adapted to fulfil the characteristic impedance of 100 Ohm (+/−10%) of a differential pair in a High-Speed mode, and each adapted to fulfil the characteristic impedance of 50 Ohm (+/−10%) when single-ended in Low-Power mode. The wires W3 and W4 are length matched with one another, i.e., they have substantially the same length for substantially the same signal propagation delay.

Similarly, the wire W5 and the entire path including the wire W1 form the Clock Lane of the D-PHY function, and thus are adapted to fulfil the characteristic impedance of 100 Ohm (+/−10%) of a differential pair in a High-Speed mode, and each adapted to fulfil the characteristic impedance of 50 Ohm (+/−10%) when single-ended in Low-Power mode. The wire W5 and the entire path including the wire W1 are length matched with one another, i.e., they have substantially the same length for substantially the same signal propagation delay. In this case, for characteristic impedance adaption and/or length matching, the entire path including the wire W1 are taken into consideration, including the wire between the pin pad PP1 and the pad P3, the conductor R1-1 between the pads P1 and P3, and even the corresponding elements in another assembly option module on the other side for another IC chip.

The pair of the wires W3 and W4 and the pair of the wires W1 and W5 are also length matched with one another, but the length matching between the two pairs is relatively loose compared to the length matching inside each pair.

When the IC chip to be assembled onto this PCB is to be configured to provide C-PHY function, a conductor R2-1 is mounted onto the PCB to connect the pad P2 and pad P3 as the second option of the first assembly option module A1. As a result, the wire W3, the wire W4, and the entire path including the wire W2 function as the three lines of the trio as the Lane of C-PHY function, while the wire W5 is not used.

In this case, the wires W3 and W4 form a differential pair out of the three lines of the trio in High-Speed mode of the C-PHY function and thus are adapted to fulfil the characteristic impedance of 100 Ohm (+/−10%). Besides, the entire path including the wire W2 form with each of the wires W3 and W4 also a differential pair out of the three lines of the trio in High-Speed mode of the C-PHY function and thus are adapted to fulfil the characteristic impedance of 100 Ohm (+/−10%). Further, in the Low-Power mode, each of the wire W3, the wire W4, and the entire path including the wire W2 is single-ended and adapted to fulfil the characteristic impedance of 50 Ohm (+/−10%).

Moreover, the wire W3, the wire W4, and the entire path including the wire W2 are length matched with each other, i.e., they have substantially the same length for substantially the same signal propagation delay.

In this case, for characteristic impedance adaption and/or length matching, the entire path including the wire W2 should be taken into consideration, including the wire between the pin pad PP1 and the pad P3, the conductor R2-1 between the pads P2 and P3, and even the corresponding elements in another assembly option module on the other side for another IC chip.

Second Example

An IC chip may use 6 pins as common pins for D-PHY and C-PHY functions. The 6 pins are not necessarily arranged together one neighboring another on the IC chip.

When the IC chip is configured to provide D-PHY function, 2 of the 6 pins are used for 2 lines of a Clock Lane, and the other 4 of the 6 pins are used for 2 Data Lanes, each including 2 pins. The Clock Lane and the 2 Data Lanes form a Link of D-PHY function between the IC chip and another device.

When the IC chip is configured to provide C-PHY function, 3 of the 6 pins are used for 3 lines of a first trio, i.e., a first Lane of C-PHY function, and the other 3 of the 6 pins are used for 3 lines of a second trio, i.e., a second Lane of C-PHY function. The first Lane and the second Lane may form one Link between the IC chip and another device, and may also form two separate Links between the IC chip and two other devices, respectively.

For such an IC chip, a PCB may be designed to include the arrangement shown in FIG. 7, in which pin pads PP1, PP2, PP3, PP4, PP5, and PP6 correspond to the 6 pins of the IC chip.

The wires W3 and W4 correspond to the two lines of a first Data Lane of the D-PHY function, and correspond to two lines out of the three lines of the first trio of the C-PHY function.

The wires W8 and W9 correspond to the two lines of a second Data Lane of the D-PHY function, and correspond to two lines out of the three lines of the second trio of the C-PHY function.

The wires W1 and W6 correspond to the two lines of the Clock Lane of the D-PHY function.

The wire W2 corresponds to a line of the three lines of the first trio of the C-PHY function, and the wire W7 corresponds to a line of the three lines of the second trio of the C-PHY function.

When the IC chip to be assembled onto this PCB is to be configured to provide D-PHY function, a conductor R1-1 is mounted onto the PCB to connect the pad P1 and pad P3 as the first option of the first assembly option module A1, and preferably a conductor R3-1 is mounted onto the PCB to connect the pad P2 and pad P4 to ground the wire W2 if the first assembly option module A1 provides the third option, e.g., as shown in FIGS. 3 to 5; and a conductor R1-2 is mounted onto the PCB to connect the pad P1 and pad P3 as the first option of the second assembly option module A2, and preferably a conductor R3-2 is mounted onto the PCB to connect the pad P2 and pad P4 to ground the wire W7 if the second assembly option module A2 provides the third option, e.g., as shown in FIGS. 3 to 5. The first assembly option module A1 and the second assembly option module A2 do not necessarily use the same arrangement as long as each of them can realize the assembly options as mentioned above. For example, one assembly option module may use the arrangement shown in FIG. 3 and the other may use the arrangement shown in FIG. 4.

As a result, the wire W1 and the wire W6 function as the two lines of the Clock Lane of the D-PHY function. At the same time, the wires W3 and W4 function as the two lines of the first Data Lane of the D-PHY function, and the wires W8 and W9 function as the two lines of the second Data Lane of the D-PHY function.

In this case, the wires W3 and W4 form the first Data Lane of the D-PHY function, and thus are adapted to fulfil the characteristic impedance of 100 Ohm (+/−10%) of a differential pair in a High-Speed mode, and each adapted to fulfil the characteristic impedance of 50 Ohm (+/−10%) when single-ended in Low-Power mode. The wires W3 and W4 are length matched with one another, i.e., they have substantially the same length for substantially the same signal propagation delay.

In this case, the wires W8 and W9 form the second Data Lane of the D-PHY function, and thus are adapted to fulfil the characteristic impedance of 100 Ohm (+/−10%) of a differential pair in a High-Speed mode, and each adapted to fulfil the characteristic impedance of 50 Ohm (+/−10%) when single-ended in Low-Power mode. The wires W8 and W9 are length matched with one another, i.e., they have substantially the same length for substantially the same signal propagation delay.

Similarly, the entire path including the wire W1 and the entire path including the wire W6 form the Clock Lane of the D-PHY function, and thus are adapted to fulfil the characteristic impedance of 100 Ohm (+/−10%) of a differential pair in a High-Speed mode, and each adapted to fulfil the characteristic impedance of 50 Ohm (+/−10%) when single-ended in Low-Power mode. The entire path including the wire W1 and the entire path including the wire W6 are length matched with one another, i.e., they have substantially the same length for substantially the same signal propagation delay. In this case, for characteristic impedance adaption and/or length matching, the entire path including the wire W1 and/or W6 are taken into consideration, including the wire between the pin pad PP1 and the pad P3, the conductor R1-1 between the pads P1 and P3, and even the corresponding elements in another assembly option module on the other side for another IC chip.

The pair of the wires W3 and W4, the pair of the wires W8 and W9, and the pair of the entire paths including W1 and W6 are also length matched with each other, but these length matchings are relatively loose compared to the length matching inside each pair.

When the IC chip to be assembled onto this PCB is to be configured to provide C-PHY function, a conductor R2-1 is mounted onto the PCB to connect the pad P2 and pad P3 as the second option of the first assembly option module A1. As a result, the wire W3, the wire W4, and the entire path including the wire W2 function as the three lines of the first trio as the first Lane of C-PHY function. A conductor R2-2 is mounted onto the PCB to connect the pad P2 and pad P3 as the second option of the second assembly option module A2. As a result, the wire W8, the wire W9, and the entire path including the wire W7 function as the three lines of the second trio as the second Lane of C-PHY function.

In this case, the wires W3 and W4 form a differential pair out of the three lines of the first trio in High-Speed mode of the C-PHY function and thus are adapted to fulfil the characteristic impedance of 100 Ohm (+/−10%). Besides, the entire path including the wire W2 form with each of the wires W3 and W4 also a differential pair out of the three lines of the first trio in High-Speed mode of the C-PHY function and thus are adapted to fulfil the characteristic impedance of 100 Ohm (+/−10%). Further, in the Low-Power mode, each of the wire W3, the wire W4, and the entire path including the wire W2 is single-ended and adapted to fulfil the characteristic impedance of 50 Ohm (+/−10%).

Moreover, the wire W3, the wire W4, and the entire path including the wire W2 are length matched with each other, i.e., they have substantially the same length for substantially the same signal propagation delay.

In this case, the wires W8 and W9 form a differential pair out of the three lines of the second trio in High-Speed mode of the C-PHY function and thus are adapted to fulfil the characteristic impedance of 100 Ohm (+/−10%). Besides, the entire path including the wire W7 form with each of the wires W8 and W9 also a differential pair out of the three lines of the second trio in High-Speed mode of the C-PHY function and thus are adapted to fulfil the characteristic impedance of 100 Ohm (+/−10%). Further, in the Low-Power mode, each of the wire W8, the wire W9, and the entire path including the wire W7 is single-ended and adapted to fulfil the characteristic impedance of 50 Ohm (+/−10%).

Moreover, the wire W8, the wire W9, and the entire path including the wire W7 are length matched with each other, i.e., they have substantially the same length for substantially the same signal propagation delay.

The first trio of the wires W2, W3, W4 and the second trio of the wires W7, W8, W9 are also length matched with each other, but this length matching is relatively loose compared to the length matching inside each trio.

In this case, for characteristic impedance adaption and/or length matching, the entire path including the wire W2 and/or W7 should be taken into consideration, including the wire between the pin pad PP1 and the pad P3, the conductor R2-1 and/or R2-2 between the pads P2 and P3, and even the corresponding elements in another assembly option module on the other side for another IC chip.

An IC chip may also provide more then 6 pins as the common pins for D-PHY and C-PHY functions. For example, an IC chip may provide 10 pins which combine above first example and second example. For another example, an IC chip may provide 12 pins which combine two of above second example.

Further Examples

Example 1. A printed circuit board, PCB, comprising:
a first pin pad (PP1), adapted to be connected to a first pin of an integrated circuit, IC, chip, wherein the first pin of the IC chip is a pin for a D-PHY function and a C-PHY function provided by the IC chip;
a first wire (W1), adapted as a line for the D-PHY function;
a second wire (W2), adapted as a line for the C-PHY function; and
a first assembly option module (A1), adapted to provide a first option of connecting the first pin pad (PP1) to the first wire (W1) if the IC chip to be assembled onto the PCB is to provide the D-PHY function, or to provide a second option of connecting the first pin pad (PP1) to the second wire (W2) if the IC chip to be assembled onto the PCB is to provide the C-PHY function.

Example 2. The PCB of Example 1, wherein the first assembly option module (A1) is adapted to provide a third option of connecting the second wire (W2) to the ground if the IC chip to be assembled onto the PCB is to provide the D-PHY function.

Example 3. The PCB of Example 1 or 2, wherein the first wire (W1) is a first line for a Clock Lane of the D-PHY function, and the second wire (W2) is a first line for a first trio of the C-PHY function.

Example 4. The PCB of Example 3, comprising a second pin pad (PP2);
a third pin pad (PP3);
a fourth pin pad (PP4);
a third wire (W3) connected to the second pin pad (PP2);
a fourth wire (W4) connected to the third pin pad (PP3); and a fifth wire (W5) connected to the fourth pin pad (PP4), wherein the second pin pad (PP2), the third pin pad (PP3), and the fourth pin pad (PP4) are adapted to be connected to a second pin, a third pin, and a fourth pin of the IC chip respectively, and the second pin, the third pin and fourth pin of the IC chip are pins for the D-PHY function and the C-PHY function provided by the IC chip;
wherein
the third wire (W3) is a first line for a first Data Lane of the D-PHY function or a second line for the first trio of the C-PHY function,
the fourth wire (W4) is a second line for the first Data Lane of the D-PHY function or a third line for the first trio of the C-PHY function,
the fifth wire (W5) is a second line for the Clock Lane of the D-PHY function.

Example 5. The PCB of Example 3, comprising
a second pin pad (PP2);
a third pin pad (PP3);
a fourth pin pad (PP4);
a fifth pin pad (PP5);
a sixth pin pad (PP6);
a third wire (W3) connected to the second pin pad (PP2);
a fourth wire (W4) connected to the third pin pad (PP3);
a sixth wire (W6);
a seventh wire (W7);
an eighth wire (W8) connected to the fifth pin pad (PP5); and
a ninth wire (W9) connected to the sixth pin pad (PP6), wherein the second pin pad (PP2), the third pin pad (PP3), the fourth pin pad (PP4), the fifth pin pad (PP5), and the sixth pin pad (PP6) are adapted to be connected to a second pin, a third pin, a fourth pin, a fifth pin, and a sixth pin of the IC chip respectively, and the second pin, the third pin, the fourth pin, the fifth pin, and the sixth pin of the IC chip are pins for the D-PHY function and the C-PHY function provided by the IC chip;
wherein
the third wire (W3) is a first line for a first Data Lane of the D-PHY function or a second line for the first trio of the C-PHY function,
the fourth wire (W4) is a second line for the first Data Lane of the D-PHY function or a third line for the first trio of the C-PHY function,
a sixth wire (W6) is a second line for the Clock Lane of the D-PHY function;
a seventh wire (W7) is a first line for a second trio of the C-PHY function;
the eighth wire (W8) is a first line for a second Data Lane of the D-PHY function or a second line for the second trio of the C-PHY function, and
the ninth wire (W9) is a second line for the second Data Lane of the D-PHY function or a third line for the second trio of the C-PHY function
wherein the PCB comprises a second assembly option module (A2), adapted to provide a first option of connecting the fourth pin pad (PP4) to the sixth wire (W6) if the IC chip to be assembled onto the PCB is to provide the D-PHY function, and to provide a second option of connecting the fourth pin pad (PP4) to the seventh wire (W7) if the IC chip to be assembled onto the PCB is to provide the C-PHY function.

Example 6. The PCB of Example 5, wherein the second assembly option module (A2) is adapted to provide a third option of connecting the seventh wire (W7) to the ground if the IC chip to be assembled onto the PCB is to provide the D-PHY function.

Example 7. The PCB of anyone of Examples 1 to 6, wherein each of the first assembly option module (A1) and the second assembly module (A2) comprises:

a first assembly option pad (P1) connected to the first wire (W1) or the sixth wire (W6), a second assembly option pad (P2) connected to the second wire (W2) or the seventh wire (W7), and a third assembly option pad (P3) connected to the first pin pad (PP1) or the fourth pin pad (PP4), wherein the first assembly option pad (P1), the second assembly option pad (P2), and the third assembly option pad (P3) are not electrically connected with each other, and are so arranged that, as the first option, the first assembly option pad (P1) and the third assembly option pad (P3) can be electrically connected through a first conductor (R1-1) or a fourth conductor (R1-2), and, as the second option, the second assembly option pad (P2) and the third assembly option pad (P3) can be electrically connected through a second conductor (R2-1) or a fifth conductor (R2-2).

Example 8. The PCB of Example 7, wherein each of the first assembly option module (A1) and the second assembly module (A2) further comprises: a fourth assembly option pad (P4) connected to the ground (GND), and the fourth assembly option pad (P4) is not electrically connected to any one of the first assembly option pad (P1), the second assembly option pad (P2), or the third assembly option pad (P3), and is so arranged that, as the third option, the fourth assembly option pad (P4) and the second assembly option pad (P2) can be electrically connected through a third conductor (R3-1) or a sixth conductor (R3-2).

Example 9. A PCB assembly, comprising:

a PCB according to Example 7 or 8;

the IC chip, assembled onto the PCB; and the first conductor (R1-1), assembled onto the PCB to electrically connect the first assembly option pad (P1) and the third assembly option pad (P3) of the first assembly option module (A1), wherein the IC chip is adapted to provide the D-PHY function; or the second conductor (R2-1), assembled onto the PCB to electrically connect the second assembly option pad (P2) and the third assembly option pad (P3) of the first assembly option module (A1), wherein the IC chip is adapted to provide the C-PHY function.

Example 10. The PCB assembly of Example 9, comprising:

the third conductor (R3-1), assembled onto the PCB to electrically connect the fourth assembly option pad (P4) and the second assembly option pad (P2) of the first assembly option module (A1), wherein the IC chip is adapted to provide the D-PHY function.

Example 11. The PCB assembly of Example 9 or 10, comprising:

the fourth conductor (R1-2), assembled onto the PCB to electrically connect the first assembly option pad (P1) and the third assembly option pad (P3) of the second assembly option module (A2), wherein the IC chip is adapted to provide the D-PHY function; or the fifth conductor (R2-2), assembled onto the PCB to electrically connect the second assembly option pad (P2) and the third assembly option pad (P3) of the second assembly option module (A2), wherein the IC chip is adapted to provide the C-PHY function.

Example 12. The PCB assembly of Example 11, comprising:

the sixth conductor (R3-2), assembled onto the PCB to electrically connect the fourth assembly option pad (P4) and the second assembly option pad (P2) of the second assembly option module (A2), wherein the IC chip is adapted to provide the D-PHY function.

Example 13. The PCB assembly of any one of Examples 9 to 12, wherein at least one of the first conductor, the second conductor, the third conductor, the fourth conductor, the fifth conductor, or the sixth conductor is a 0 Ohm resistor, preferably a surface mounted device, SMD, 0 Ohm resistor.

While the invention has been described with reference to the above examples, it is to be understood that the description is for illustration purposes only. Accordingly, it is intended that the invention be limited only by the scope of the claims appended hereto.

REFERENCE NUMERAL LIST

A1, A1': first assembly option module
A2, A2': second assembly option module
P1 to P4: first to fourth assembly option pad
PP1 to PP6: first to sixth pin pad
R1-1: first conductor
R1-2: fourth conductor
R2-1: second conductor
R2-2: fifth conductor
R3-1: third conductor
R3-2: sixth conductor
W1 to W9: first to ninth wire

What is claimed is:

1. A printed circuit board (PCB) comprising:
a first pin pad adapted to be connected to a first pin of an integrated circuit (IC) chip, wherein the first pin of the IC chip is a pin for a D-PHY function and a C-PHY function, according to the Mobile Industry Processor Interface (MIPI) alliance, provided by the IC chip;
a first wire adapted as a line for the D-PHY function;
a second wire adapted as a line for the C-PHY function; and
a first assembly option module adapted to provide a first option of connecting the first pin pad to the first wire if the IC chip to be assembled onto the PCB is to provide the D-PHY function, or to provide a second option of connecting the first pin pad to the second wire if the IC chip to be assembled onto the PCB is to provide the C-PHY function;
wherein the first wire is a first line for a Clock Lane of the D-PHY function, and the second wire is a first line for a first trio of the C-PHY function.

2. The PCB of claim 1, wherein the first assembly option module is adapted to provide a third option of connecting the second wire to ground if the IC chip to be assembled onto the PCB is to provide the D-PHY function.

3. The PCB of claim 1, further comprising:
a second pin pad;
a third pin pad;
a fourth pin pad;
a third wire connected to the second pin pad;
a fourth wire connected to the third pin pad; and
a fifth wire connected to the fourth pin pad,
wherein the second pin pad, the third pin pad, and the fourth pin pad are adapted to be connected to a second pin, a third pin, and a fourth pin of the IC chip respectively, and the second pin, the third pin and fourth pin of the IC chip are pins for the D-PHY function and the C-PHY function provided by the IC chip;

wherein the third wire is a first line for a first Data Lane of the D-PHY function or a second line for the first trio of the C-PHY function, the fourth wire is a second line for the first Data Lane of the D-PHY function or a third line for the first trio of the C-PHY function, the fifth wire is a second line for the Clock Lane of the D-PHY function.

4. The PCB of claim 1, further comprising a second pin pad;

a third pin pad;

a fourth pin pad;

a fifth pin pad;

a sixth pin pad;

a third wire connected to the second pin pad;

a fourth wire connected to the third pin pad;

a sixth wire;

a seventh wire;

an eighth wire connected to the fifth pin pad; and a ninth wire connected to the sixth pin pad, wherein the second pin pad, the third pin pad, the fourth pin pad, the fifth pin pad, and the sixth pin pad are adapted to be connected to a second pin, a third pin, a fourth pin, a fifth pin, and a sixth pin of the IC chip respectively, and the second pin, the third pin, the fourth pin, the fifth pin, and the sixth pin of the IC chip are pins for the D-PHY function and the C-PHY function provided by the IC chip;

wherein the third wire is a first line for a first Data Lane of the D-PHY function or a second line for the first trio of the C-PHY function, the fourth wire is a second line for the first Data Lane of the D-PHY function or a third line for the first trio of the C-PHY function, a sixth wire is a second line for the Clock Lane of the D-PHY function;

a seventh wire is a first line for a second trio of the C-PHY function;

the eighth wire is a first line for a second Data Lane of the D-PHY function or a second line for the second trio of the C-PHY function, and the ninth wire is a second line for the second Data Lane of the D-PHY function or a third line for the second trio of the C-PHY function wherein the PCB comprises a second assembly option module, adapted to provide a first option of connecting the fourth pin pad to the sixth wire if the IC chip to be assembled onto the PCB is to provide the D-PHY function, and to provide a second option of connecting the fourth pin pad to the seventh wire if the IC chip to be assembled onto the PCB is to provide the C-PHY function.

5. The PCB of claim 4, wherein the second assembly option module is adapted to provide a third option of connecting the seventh wire to ground if the IC chip to be assembled onto the PCB is to provide the D-PHY function.

6. The PCB of claim 1, wherein each of the first assembly option module and the second assembly module comprises:

a first assembly option pad connected to the first wire or the sixth wire, a second assembly option pad (connected to the second wire or the seventh wire, and a third assembly option pad connected to the first pin pad or the fourth pin pad, wherein the first assembly option pad, the second assembly option pad, and the third assembly option pad are not electrically connected with each other, and are so arranged that, as the first option, the first assembly option pad and the third assembly option pad can be electrically connected through a first conductor or a fourth conductor, and, as the second option, the second assembly option pad and the third assembly option pad can be electrically connected through a second conductor or a fifth conductor.

7. The PCB of claim 6, wherein each of the first assembly option module and the second assembly module further comprises:

a fourth assembly option pad connected to ground (GND), and the fourth assembly option pad is not electrically connected to any one of the first assembly option pad, the second assembly option pad, or the third assembly option pad, and is so arranged that, as the third option, the fourth assembly option pad and the second assembly option pad can be electrically connected through a third conductor or a sixth conductor.

8. A PCB assembly, comprising:

a PCB according to claim 6;

the IC chip, assembled onto the PCB; and the first conductor, assembled onto the PCB to electrically connect the first assembly option pad and the third assembly option pad of the first assembly option module, wherein the IC chip is adapted to provide the D-PHY function; or the second conductor, assembled onto the PCB to electrically connect the second assembly option pad and the third assembly option pad of the first assembly option module, wherein the IC chip is adapted to provide the C-PHY function.

9. The PCB assembly of claim 8, comprising:

the third conductor, assembled onto the PCB to electrically connect the fourth assembly option pad and the second assembly option pad of the first assembly option module, wherein the IC chip is adapted to provide the D-PHY function.

10. The PCB assembly of claim 8, comprising:

the fourth conductor, assembled onto the PCB to electrically connect the first assembly option pad and the third assembly option pad of the second assembly option module, wherein the IC chip is adapted to provide the D-PHY function; or the fifth conductor, assembled onto the PCB to electrically connect the second assembly option pad and the third assembly option pad of the second assembly option module, wherein the IC chip is adapted to provide the C-PHY function.

11. The PCB assembly of claim 10, comprising:

the sixth conductor, assembled onto the PCB to electrically connect the fourth assembly option pad and the second assembly option pad of the second assembly option module, wherein the IC chip is adapted to provide the D-PHY function.

12. The PCB assembly of claim 8, wherein at least one of the first conductor, the second conductor, the third conductor, the fourth conductor, the fifth conductor, or the sixth conductor is a surface mounted device 0 Ohm resistor.

* * * * *